(12) United States Patent
Apelsmeier et al.

(10) Patent No.: US 10,439,605 B2
(45) Date of Patent: Oct. 8, 2019

(54) CIRCUIT ARRANGEMENT FOR AN ELECTRONIC DEVICE

(71) Applicant: AUDI AG, Ingolstadt (DE)

(72) Inventors: Andreas Apelsmeier, Pollenfeld (DE); Johann Asam, Adelzhausen (DE)

(73) Assignee: AUDI AG, Ingolstadt (DE)

(*) Notice: Subject to any disclaimer, the term of this patent is extended or adjusted under 35 U.S.C. 154(b) by 0 days.

(21) Appl. No.: 15/887,259

(22) Filed: Feb. 2, 2018

(65) Prior Publication Data

US 2018/0226966 A1 Aug. 9, 2018

(30) Foreign Application Priority Data

Feb. 6, 2017 (DE) .................. 10 2017 201 817

(51) Int. Cl.
| | | |
|---|---|---|
| *H03K 17/567* | (2006.01) | |
| *H05K 5/00* | (2006.01) | |
| *H01L 25/07* | (2006.01) | |
| *H01L 29/20* | (2006.01) | |
| *H02M 1/088* | (2006.01) | |

(Continued)

(52) U.S. Cl.
CPC .......... *H03K 17/567* (2013.01); *H01L 25/072* (2013.01); *H01L 29/2003* (2013.01); *H02M 1/088* (2013.01); *H03K 17/04123* (2013.01); *H03K 17/04126* (2013.01); *H05K 5/0021* (2013.01); *H02M 7/003* (2013.01)

(58) Field of Classification Search
CPC .......... H03K 17/567; H03K 17/04123; H03K 17/04126; H01L 25/072; H02M 1/088; H02M 7/003; H05K 5/0021
See application file for complete search history.

(56) References Cited

U.S. PATENT DOCUMENTS

| | | | | |
|---|---|---|---|---|
| 6,522,089 B1* | 2/2003 | Duong | .............. | H05B 41/2928 315/291 |
| 2003/0038615 A1* | 2/2003 | Elbanhawy | ......... | H02M 3/1584 323/282 |
| 2010/0080024 A1 | 4/2010 | Wei et al. | | |

(Continued)

FOREIGN PATENT DOCUMENTS

| | | |
|---|---|---|
| DE | 100 10 957 A1 | 9/2001 |
| DE | 102 97 140 T5 | 9/2004 |

(Continued)

OTHER PUBLICATIONS

German Office Action dated Jan. 23, 2018, in connection with corresponding DE Application No. 10 2017 201 817.8 (12 pgs.).

(Continued)

*Primary Examiner* — Daniel C Puentes
(74) *Attorney, Agent, or Firm* — Maier & Maier, PLLC

(57) ABSTRACT

A circuit arrangement for an electronic device having at least two semiconductor elements of the same type connected in parallel with each other. At least one first semiconductor element has a first characteristic and at least one second semiconductor element has a second characteristic. Each of the two characteristics is defined by at least one power loss. The at least one power loss of the at least one first semiconductor element has a first value, and the at least one power loss of the at least one second semiconductor element has a second value. The two values of the at least one power loss are different.

7 Claims, 3 Drawing Sheets

(51) Int. Cl.
*H03K 17/0412* (2006.01)
*H02M 7/00* (2006.01)

(56) References Cited

U.S. PATENT DOCUMENTS

2013/0257177 A1*  10/2013  Jacobson ................ H02M 1/08
                                                      307/115
2016/0043616 A1    2/2016  Krishnamurthy et al.

FOREIGN PATENT DOCUMENTS

| DE | 102009049991 A1 | 7/2010 |
| DE | 102011108495 A1 | 9/2012 |
| DE | 10 2012 205 725 A1 | 10/2013 |
| DE | 10 2014 224 169 A1 | 6/2016 |
| EP | 2524834 A1 | 11/2012 |

OTHER PUBLICATIONS

Search Report dated Jul. 6, 2018 in corresponding European Application No. 18155057.5, 8 pages.

* cited by examiner

CIRCUIT ARRANGEMENT FOR AN ELECTRONIC DEVICE

FIELD

The invention relates to a circuit arrangement for an electronic device.

BACKGROUND

An electronic power module may be designed, e.g., as a B6 bridge or as a single half-bridge. As a rule, the power module comprises several semiconductor components which are physically connected together in parallel, such as IGBTs or MOSFETs, with which the required current is provided each time. In this case, these semiconductor components are of the same type and are designed, e.g., as silicon IGBTs with upstream connected silicon diodes. Alternatively, a silicon carbide diode can be connected in parallel to a silicon IGBT. The semiconductor components connected in parallel, however, are always from the same manufacturer and are of the same type. Furthermore, one tries to distribute the current in the power module as symmetrically as possible over all semiconductor components connected in parallel. As a rule, this power module is optimized for a compromise between conduction losses and switching losses. However, only one point of a trade-off characteristic curve can be used therewith, and a characteristic of the power module is based on a compromise design of only one type of semiconductor component.

SUMMARY

Given this background, an object was to adapt a characteristic of a power module.

The electronic circuit arrangement according to the invention, for example, a power module, is intended for an electronic device and has at least two semiconductor elements or semiconductor components of the same type which are arranged or connected together in parallel, wherein at least one first semiconductor element has a first characteristic and at least one second semiconductor element has a second characteristic, each of the two characteristics being defined by at least one power loss. The at least one power loss of the at least one first semiconductor element has a first value, while the at least one power loss of the at least one second semiconductor element has a second value, the two values of the at least one power loss being different.

The at least two semiconductor elements connected together in parallel are similar in design, which generally means that they are of the same type, e.g., the same semiconductor type, and/or have the same circuitry structure or architecture. However, it is nonetheless provided that these at least two semiconductor elements of the same type differ from each other with respect to at least one characteristic, usually of the power loss, and thus with respect to at least one physical property, even though the same structure or architecture is present for the at least two semiconductor elements. Usually the two semiconductor elements of the same type are either active or passive semiconductor elements.

In configuration, a first power loss is designed or defined as a conduction loss and a second power loss is defined as a switching loss. Accordingly, the at least two semiconductor elements of the same type and connected together in parallel differ at least with respect to their conduction loss and/or switching loss as the at least one power loss and thus with respect to one operating parameter, but are otherwise of the same type.

The at least one first semiconductor element has a conduction loss with a first value which is higher than a second value of a conduction loss of the at least one second semiconductor element, having a design of the same type as that of the first semiconductor element, wherein then the at least one first semiconductor element has a switching loss with a first value which is less than a second value of a switching loss of the at least one second semiconductor element.

Accordingly, the at least one second semiconductor element has a conduction loss with the second value which is less than the first value of the conduction loss of the at least one first semiconductor element, wherein the at least one second semiconductor element, having a design of the same type as that of the first element, has a switching loss with the second value which is higher than the first value of the switching loss of the at least one first semiconductor element.

Furthermore, it is possible for two semiconductor elements of the same type whose values for the at least one characteristic and/or power loss differ from each other to be connected directly next to each other.

The at least two semiconductor elements are designed, e.g., as integrated-gate bipolar transistors (IGBTs).

Alternatively or additionally, the at least two semiconductor elements are designed, e.g., as metal oxide semiconductor field effect transistors (MOSFETs).

Thus, it is possible for two semiconductor elements connected in parallel, which are designed as integrated-gate bipolar transistors and thus are of the same type, to have the at least one different characteristic or power loss, i.e., a conduction loss and/or a switching loss. Furthermore, it is possible for two semiconductor elements connected in parallel having a design as a metal oxide semiconductor field effect transistor and thus of the same type, to have the at least one different characteristic or power loss, i.e., a conduction loss and/or a switching loss.

Moreover, it is possible for at least two semiconductor elements, usually integrated-gate bipolar transistors (IGBT) or possibly metal oxide semiconductor field effect transistors, to be connected in series with a diode as an additional semiconductor element, this diode being connected upstream or downstream from the at least one semiconductor element. Depending on the definition, at least one semiconductor element is designed as an electronic component made of semiconductor material, wherein a particular semiconductor element has at least one electronic component, i.e., one electronic component or several electronic components. A semiconductor element is usually designed and/or designated as the smallest possible compact electronic component, for example, a MOSFET, IGBT, transistor or diode.

The at least two semiconductor elements of the same type have silicon or silicon carbide (SiC) in one configuration. In another configuration, the at least two semiconductor elements have gallium nitride.

For the at least one first semiconductor element there is provided in one configuration a first characteristic, which is designed and/or is designated as, e.g., a trade-off characteristic and which represents and/or describes a relationship between the switching loss and the conduction loss or an interdependency of the switching loss and the conduction loss of the at least one first semiconductor element. For the at least one second semiconductor element, a second characteristic is provided in one configuration, which represents and/or describes a relationship between the switching loss and the conduction loss or an interdependency of the switching loss and the conduction loss of the at least one second semiconductor element. In this case, these two characteristics for said at least two semiconductor elements connected in parallel are shifted relative to each other with respect to the relationship between conduction loss and switching loss.

Alternatively, it is possible for the at least two semiconductor elements of the same type to have the same characteristic, wherein the at least two semiconductor elements are operated at different points along this characteristic.

The circuit arrangement in one configuration is designed as a half-bridge and/or for a device for controlling a vehicle, for example, a motor vehicle.

By providing at least two semiconductor elements connected in parallel and of the same type with at least one different power loss, it is possible to provide a hybrid circuit arrangement for an electronic power module. This circuit arrangement or a corresponding power module in configuration can be installed at various locations in a vehicle. This is the case for a steering system or a transmission control system, for example, in a voltage range of 12 volts. However, applications are also possible in a high-voltage range, for example in a hybrid electric vehicle (HEV) or plug-in hybrid electric vehicle (PHEV). The circuit arrangement with the semiconductor elements connected in parallel differing from each other with respect to the power loss can be installed, for example, in a traction pulse inverter, in an electric air compressor (eKK) or in a DC or DC/DC converter.

Furthermore, it is proposed to use a combination of semiconductor elements of the same type and connected in parallel for the circuit arrangement, these elements being designed, for example, as fast-switching MOSFETs based on silicon, for example, silicon carbide (SiC), or, for example, as IGBTs, which are highly optimized for conduction losses. In this case, it is possible to consider different trade-off characteristics and trade-off points for the semiconductor elements connected in parallel, i.e., ones which are generally shifted relative to each other. Furthermore, a combination of IGBTs with different power losses is conceivable. The semiconductor elements in configuration are also connected in series with diodes, although these might not be needed when using MOSFETs. Thus, it is possible for two semiconductor elements connected in parallel to comprise only MOSFETs. Alternatively, two semiconductor elements connected in parallel are designed as IGBTs with upstream or downstream connected diodes. Moreover, it is possible to optimally establish a trade-off between efficiency and maximum output power.

The circuit arrangement with the at least two semiconductor elements of the same type and connected in parallel can be used for a device in a vehicle. In this case, it is proposed, for an adjusting of different characteristics of these semiconductor elements of the same type during a driving cycle under load, for example, to vary their power losses and possibly also their chip surfaces, for example, wherein a common minimum power loss and thus an optimized efficiency can be adjusted for the semiconductor elements of the same type and connected in parallel.

In another configuration, with a combination of a first semiconductor element, which is designed as an IGBT, optionally with diode connected in series, and a second semiconductor element designed as a MOSFET, connected in parallel therewith, one can achieve fast switching speeds and good conduction properties through the MOSFET in the low-load range and through the IGBT in the high-load range. Moreover, an optimized efficiency with an improved overload capability can be provided in the normal operation of the circuit arrangement. Costs and structural space can be reduced for a required surface area of the circuit arrangement.

On the whole, one possible embodiment of the proposed circuit arrangement has at least two semiconductor elements connected in parallel with different characteristics and thus with at least one different type of power loss. This will be the case, for example, when these at least two semiconductor elements have a different type of architecture, are made of different materials, come from different wafers or disc-shaped blanks of semiconductor material, and/or have been produced by different manufacturers. In this case, it is possible for the at least two semiconductor elements connected in parallel to have, on the one hand, a bipolar behavior (IGBT) and, on the other hand, an ohmic and/or unipolar behavior (MOSFET). The at least two semiconductor elements differing from each other with respect to their characteristic comprise silicon and/or gallium nitride, for example.

Further advantages and configurations of the invention will emerge from the description and the appended drawing.

It is understood that the features mentioned above and yet to be explained in the following may be used not only in the particular combination indicated, but also in other combinations or standing alone, without leaving the scope of the present invention.

BRIEF DESCRIPTION OF THE DRAWINGS

The invention is represented schematically in the drawing based on embodiments and shall be described schematically and in detail with reference to the drawing.

The figures are described coherently and comprehensively, assigning the same reference numbers to the same components.

DETAILED DESCRIPTION OF THE DRAWINGS

Figure 1:
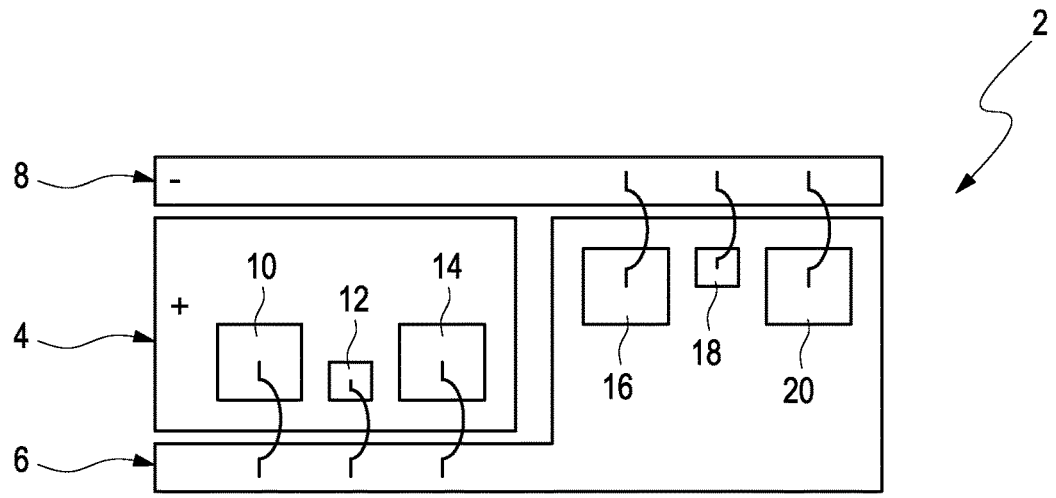
FIG. 1a shows a first embodiment of the circuit arrangement according to the invention in a first schematic representation.
FIG. 1b shows a first embodiment of the circuit arrangement according to the invention in a second schematic representation.
Figure 1:
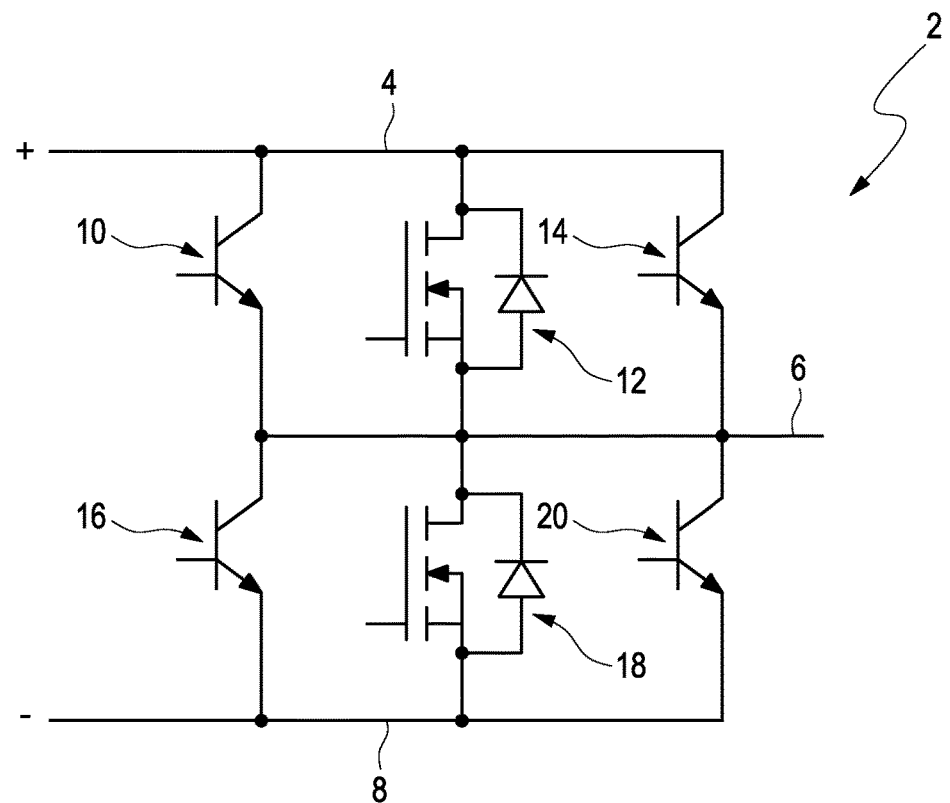

FIG. 1a shows a first schematic representation of the first embodiment of the circuit arrangement 2 according to the invention and FIG. 1b shows a second schematic representation of this first embodiment of the circuit arrangement 2. In this case, the circuit arrangement 2 is divided into a positive busbar or a plus pole 4, a phase 6, and a negative busbar or a minus pole 8, wherein the phase 6 is arranged between the plus pole 4 and the minus pole 8. The plus pole 4 is connected to three semiconductor elements connected in parallel 10, 12, 14. These three semiconductor elements connected in parallel 10, 12, 14 are connected in series with three other semiconductor elements connected in parallel 16, 18, 20.

A first semiconductor element 10 here is designed as an IGBT, a second semiconductor element 12 as a MOSFET, and a third semiconductor element 14 as an IGBT. In this case, the second semiconductor element 12 differs with respect to at least one power loss, i.e., with respect to a conduction loss and/or a switching loss, from the other two semiconductor elements 10, 14, with which this second semiconductor element 12 is connected in parallel. Furthermore, the first and the third semiconductor elements 10, 14, which are designed as IGBTs and thus as semiconductor elements of the same type 10, 14, likewise differ with respect to at least one power loss.

Moreover, a fourth semiconductor element 16 is designed as an IGBT, a fifth semiconductor element 18 as a MOSFET, and a sixth semiconductor element 20 as an IGBT. In this case, the fifth semiconductor element 18 also differs with respect to at least one power loss, i.e., with respect to the conduction loss and/or the switching loss, from the other two semiconductor elements connected in parallel 16, 18. Moreover, it is provided here that the fourth and sixth semiconductor elements 16, 20, both of which are designed as IGBTs and thus as semiconductor elements of the same type 16, 20, differ with respect to at least one power loss.

Furthermore, it is provided that the first semiconductor element 10 is connected in series with the fourth semiconductor element 16. The second semiconductor element 12 and the fifth semiconductor element 18 are likewise connected in series. Moreover, the third semiconductor element 14 and the sixth semiconductor element 20 are connected in series.

All four semiconductor elements 10, 14, 16, 20 designed overall as IGBTs are of the same type with respect to their architecture, their kind, and/or their circuitry. It is provided here that the first semiconductor element 10 also differs with respect to at least one power loss from the sixth semiconductor element 20, and the third semiconductor element 14 from the fourth semiconductor element 16, being connected in parallel in each case.

Figure 2:
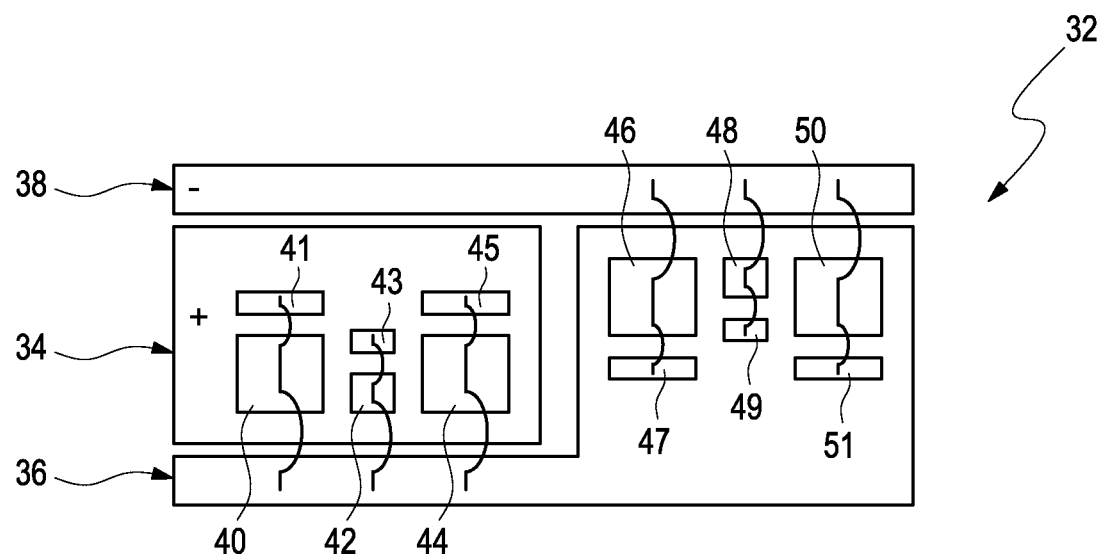
FIG. 2a shows a second embodiment of the circuit arrangement according to the invention in a first schematic representation.
FIG. 2b shows a second embodiment of the circuit arrangement according to the invention in a second schematic representation.
Figure 2:
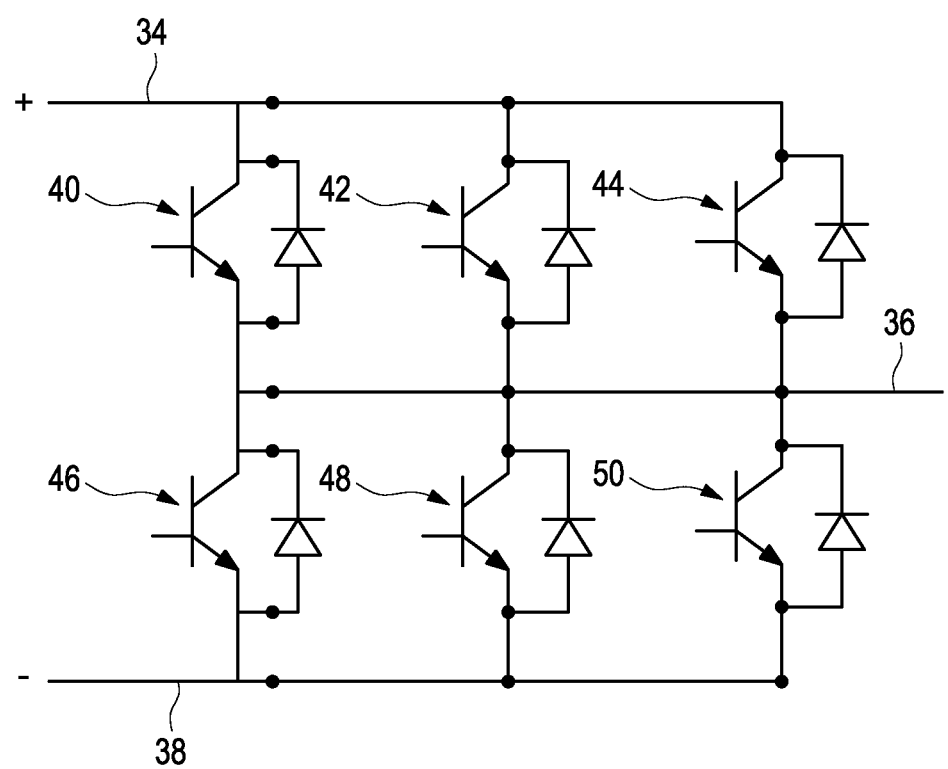

FIG. 2a shows a first schematic representation and FIG. 2b a second schematic representation of the second embodiment of the circuit arrangement according to the invention. In this case, the circuit arrangement 32 is divided into a positive busbar or a plus pole 34, a phase 36, and a negative busbar or a minus pole 38, wherein the phase 36 is arranged between the plus pole 34 and the minus pole 38. The plus pole 34 is connected to three semiconductor elements connected in parallel 40, 42, 44.

A first semiconductor element 40 here is designed as an IGBT with a first characteristic, a second semiconductor element 42 as an IGBT with a second characteristic, and a third semiconductor element 44 as an IGBT with the same first characteristic as the first semiconductor element 40. The second semiconductor element 42 differs here with respect to at least one power loss, i.e., with respect to a conduction loss and/or a switching loss, from each one of the other two semiconductor elements 40, 44.

It is possible here for the conduction loss of the second semiconductor element 42 to be greater than a particular conduction loss of one of the other two semiconductor elements 40, 44, while the switching loss of the first semiconductor element 40 and that of the third semiconductor element 44 are each greater than the switching loss of the second semiconductor element 42.

Furthermore, each of the three semiconductor elements 40, 42, 44 is connected in series with a diode 41, 43, 45. It is possible for these three diodes 41, 43, 45 to have the same characteristic. However, it is also possible for the diode 43, which is connected in series to the second semiconductor element 42, to have a different characteristic than each one of the two diodes 41, 45 which are connected in series to the other two semiconductor elements 40, 44, each differing with respect to their characteristic from the second semiconductor element 42.

Furthermore, this circuit arrangement 32 comprises a fourth semiconductor element 46, a fifth semiconductor element 48 and a sixth semiconductor element 50. In this case, the fourth semiconductor element 46 is also designed as an IGBT with the first characteristic, the fifth semiconductor element 48 as an IGBT with the second characteristic and the sixth semiconductor element 50 as an IGBT with the first characteristic.

Thus, the fifth semiconductor element 48 with the second characteristic differs with respect to at least one power loss, i.e., with respect to the switching loss and/or the conduction loss, from the other two semiconductor elements connected in parallel 46, 50 having the first characteristic and thus the at least one first power loss.

The fourth semiconductor element 46 is furthermore connected in series to a diode 47. The fifth semiconductor element 48 is connected in series to a diode 49. Furthermore, the sixth semiconductor element 50 is connected in series to a diode 51. In this case, the two diodes 47, 51, each being connected in series to a semiconductor element 46, 50, have a characteristic which differs from the characteristic of the diode 49 which is connected in series to the fifth semiconductor module 48.

Moreover, it is provided within this circuit arrangement 32 that the first semiconductor element 40 and the fourth semiconductor element 46, both of which have the same first characteristic, are connected in series. Moreover, the second semiconductor element 42 and the fifth semiconductor element 48, having the same second characteristic, are connected here in series. The third semiconductor element 44 and the sixth semiconductor element 50, having the same first characteristic, are likewise connected here in series.

In all possible embodiments of circuit arrangements 2, 32 according to the invention it is provided that at least two semiconductor elements connected in parallel and of the same type 10, 14, 16, 20, 40, 42, 44, 46, 48, 50 differ from each other with respect to their characteristic, here, with respect to at least one power loss. This is the case, as with the first embodiment of the circuit arrangement 2, when the two semiconductor elements connected in parallel and of the same type 10, 14, 16, 20 have the same architecture and are designed as IGBTs, yet have different characteristics.

However, it is also possible for two semiconductor elements 40, 42, 44, 46, 48, 50 arranged in parallel with each other, such as, for example, in the case of the second circuit arrangement 32, to have the same architecture, and to be designed here as IGBTs, yet to differ from each other with respect to at least one power loss, i.e., with respect to the switching loss and/or conduction loss. This is already the case when the two semiconductor elements 40, 42, 44, 46, 48, 50 arranged in parallel with each other differ from each other only with respect to one power loss, i.e., only with respect to the switching loss or the conduction loss, yet have a second power loss with the same value each time.

Figure 3:
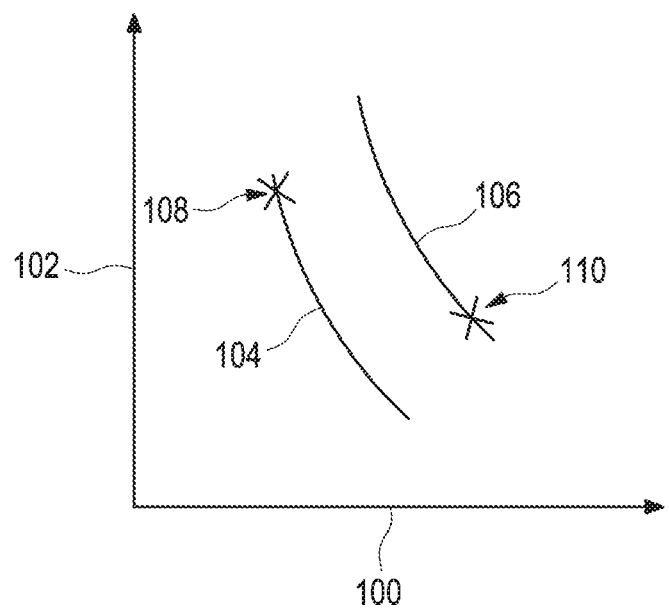
FIG. 3 shows a diagram with characteristic curves which may be considered for at least one embodiment of the circuit arrangement.

In this regard, refer to the diagram in FIG. 3, in which a conduction loss ($V_{ce}$) is plotted along an abscissa 100 as the first power loss. Along an ordinate 102 of this diagram in FIG. 3 is plotted a switching loss ($E_{off}$) as a second power loss.

In the diagram of FIG. 3, a first characteristic curve 104 is plotted for a first semiconductor element, and a second characteristic curve 106 is plotted for a second semiconductor element. It is provided here that the two semiconductor elements have the same architecture and are designed here, for example, as IGBTs or alternatively as MOSFETs, and accordingly as semiconductor elements of the same type. The two characteristic curves 104, 106, also known as trade-off characteristic curves, show a particular relationship between conduction loss and switching loss of a particular semiconductor element. Since the two characteristic curves 104, 106 are shifted in parallel to each other, the two semiconductor elements differ here from each other with respect to their conduction loss and their switching loss.

In one embodiment of the circuit arrangement, these two semiconductor elements of the same type are connected in parallel to each other. Furthermore, a first trade-off point 108 for the first semiconductor element is established along the first characteristic curve 104 and a second trade-off point 110 for the second semiconductor element is established along the second characteristic curve 106. Accordingly, the first semiconductor element has a higher conduction loss than the second semiconductor element, while the second semiconductor element has a higher switching loss than the first semiconductor element.

In another embodiment of the circuit arrangement, the same trade-off characteristic curve is provided for both semiconductor elements connected in parallel and of the same type. In this case, a first trade-off point is provided for the first semiconductor element, and a second trade-off point is provided for the second semiconductor element, these two semiconductor elements of the same type differing from each other both with respect to the conduction loss and with respect to the switching loss.

The invention claimed is:

1. A circuit arrangement for an electronic device, comprising:
at least two semiconductor elements of the same type and connected in parallel to each other, wherein at least one first semiconductor element has a first characteristic and at least one second semiconductor element has a second characteristic, wherein each of the two characteristics is defined by at least one power loss, wherein the at least one power loss of the at least one first semiconductor element has a first value, wherein the at least one power loss of the at least one second semiconductor element has a second value, wherein the two values of the at least one power loss are different;
wherein each of the at least two semiconductor elements having the same type is of a type included in the set of: metal oxide semiconductor field effect transistors (MOSFETs) and integrated-gate bipolar transistors (IGBTs),
wherein at least one third semiconductor is connected in series to the at least one first semiconductor, and at least one fourth semiconductor is connected in series to the at least one second semiconductor, and
wherein the circuit arrangement is designed as a half-bridge,
wherein a first power loss is defined as a conduction loss and a second power loss is defined as a switching loss, and
wherein for the at least one first semiconductor element, a first characteristic curve is provided, which describes a relationship between the switching loss and the conduction loss, and in which, for the at least one second semiconductor element, a second characteristic curve is provided, which describes a relationship between the switching loss and the conduction loss, wherein these two characteristic curves are shifted relative to each other so that the at least one first semiconductor element and the at least one second semiconductor element are configured with at least two trade-off points for a trade-off compromising design.

2. The circuit arrangement according to claim 1, wherein the at least one first semiconductor element has a conduction loss with a first value which is higher than a second value of a conduction loss of the at least one second semiconductor element, and wherein the at least one first semiconductor element has a switching loss with a first value which is less than a second value of a switching loss of the at least one second semiconductor element.

3. The circuit arrangement according to claim 1, wherein the at least two semiconductor elements of the same type are designed as bipolar transistors with integrated gate electrodes.

4. The circuit arrangement according to claim 1, wherein the at least two semiconductor elements of the same type are designed as metal oxide semiconductor field effect transistors.

5. The circuit arrangement according to claim 1, wherein at least one semiconductor element of the at least two semiconductor elements of the same type is connected in series with a diode.

6. The circuit arrangement according to claim 1, wherein the at least two semiconductor elements includes silicon.

7. The circuit arrangement according to claim 1, wherein the at least two semiconductor elements of the same type comprise gallium nitride.

* * * * *